(12) United States Patent
Tsai et al.

(10) Patent No.: US 11,196,949 B2
(45) Date of Patent: Dec. 7, 2021

(54) SUBRANGE ADC FOR IMAGE SENSOR

(71) Applicant: OmniVision Technologies, Inc., Santa Clara, CA (US)

(72) Inventors: Chao-Fang Tsai, San Jose, CA (US); Zheng Yang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 8 days.

(21) Appl. No.: 16/590,446

(22) Filed: Oct. 2, 2019

(65) Prior Publication Data

US 2021/0105422 A1 Apr. 8, 2021

(51) Int. Cl.
*H04N 5/357* (2011.01)
*H03M 1/46* (2006.01)
*H04N 5/378* (2011.01)
*H03M 1/56* (2006.01)
*H03M 1/12* (2006.01)

(52) U.S. Cl.
CPC .......... *H04N 5/3575* (2013.01); *H03M 1/124* (2013.01); *H03M 1/462* (2013.01); *H03M 1/466* (2013.01); *H03M 1/56* (2013.01); *H04N 5/378* (2013.01)

(58) Field of Classification Search
CPC ..... H04N 5/3575; H04N 5/378; H03M 1/462; H03M 1/466; H03M 1/56; H03M 1/124
See application file for complete search history.

(56) References Cited

U.S. PATENT DOCUMENTS

| | | | |
|---|---|---|---|
| 8,581,761 B1* | 11/2013 | Bahukhandi | H03M 1/0863 341/118 |
| 9,450,596 B2 | 9/2016 | Kim et al. | |
| 9,743,029 B2* | 8/2017 | Gou | H04N 5/378 |
| 2009/0261998 A1* | 10/2009 | Chae | H03M 3/46 341/118 |
| 2011/0057823 A1* | 3/2011 | Harpe | H03M 1/125 341/133 |
| 2012/0287316 A1* | 11/2012 | Kim | H04N 5/378 348/294 |

(Continued)

OTHER PUBLICATIONS

Wikipedia—Buffer amplifier, revision as of Jun. 25, 2018, retrieved from https://en.wikipedia.org/w/index.php?title=Buffer_amplifier &oldid=847522439 on Mar. 29, 2021 (Year: 2018).*

*Primary Examiner* — Timothy J Henn

(57) ABSTRACT

A subrange analog-to-digital converter (ADC) converts analog image signal received from a bitline to a digital signal through an ADC comparator. The comparator is shared by a successive approximation register (SAR) ADC coupled to provide M upper output bits (UOB) of the subrange ADC and a ramp ADC coupled to provide N lower output bits (LOB). The digital-to-analog converter (DAC) of the SAR ADC comprises M buffered bit capacitors connected to the comparator. Each buffered bit capacitor comprises a bit capacitor, a bit buffer, and a bit switch controlled by one of the UOB of the SAR ADC. A ramp buffer is coupled between a ramp generator and a ramp capacitor. The ramp capacitor is further coupled to the same comparator. The implementation of ramp buffer and the bit buffers as well as their sharing of the same kind of buffer reduces differential nonlinear (DNL) error of the subrange ADC.

16 Claims, 2 Drawing Sheets

(56) References Cited

U.S. PATENT DOCUMENTS

| | | | | |
|---|---|---|---|---|
| 2013/0341489 | A1* | 12/2013 | Yoshida | H03M 1/1225 |
| | | | | 250/208.1 |
| 2014/0008515 | A1* | 1/2014 | Wang | H03M 1/145 |
| | | | | 250/208.1 |
| 2014/0247177 | A1* | 9/2014 | Draxelmayr | H03M 1/0692 |
| | | | | 341/156 |
| 2015/0008308 | A1* | 1/2015 | Huang | H03M 1/0863 |
| | | | | 250/208.1 |
| 2015/0303937 | A1* | 10/2015 | Gou | H03M 1/14 |
| | | | | 250/208.1 |
| 2015/0372688 | A1* | 12/2015 | Hashimoto | H03M 1/002 |
| | | | | 348/294 |
| 2016/0191069 | A1* | 6/2016 | Gou | H03M 1/1245 |
| | | | | 341/118 |
| 2019/0115931 | A1* | 4/2019 | Hurwitz | H03M 1/123 |

* cited by examiner

SUBRANGE ADC FOR IMAGE SENSOR

TECHNICAL FIELD

This disclosure relates generally to image sensors, and in particular but not exclusively, relates to analog to digital conversion (ADC) circuitry for use in reading out image data from an image sensor.

BACKGROUND INFORMATION

Image sensors have become ubiquitous. They are widely used in digital still cameras, cellular phones, security cameras, as well as, medical, automobile, and other applications. Image sensors commonly utilize Complementary-Metal-Oxide-Semiconductor (CMOS) image sensors to capture image data of an imaged scene. CMOS devices include an array of pixels which are photosensitive to incident light from a scene for a particular amount of time. This exposure time allows charges of individual pixels to accumulate until the pixels have a particular signal voltage value, also known as the pixel grey value. These individual signal voltage values may then be correlated into digital image data representing the imaged scene.

Image quality is very important. To achieve higher quality, the increase of the number of pixels within the array provides one solution. To eliminate as much noise in the image data as possible provides the other. A common way in CMOS image sensors to reduce noise is correlated double sampling (CDS). CDS reduces the noise in the signal by calculating the difference between the signal voltage value (image grey value), and a reset signal (image black background noise, also called dark current noise) for the given pixel. Implementing CDS reduces the fixed pattern noise and other temporal noise from the image data. Correlated double sampling may be done in analog or digital domain.

A system for digital correlated double sampling for an image sensor having a plurality of pixels includes: an analog-to-digital convertor (ADC) stage for converting analog data into digital image data and outputting reset data; memory for storing both the digital image data and the reset data; and a digital correlated double sampling (DCDS) stage for generating digitally correlated double sampled image data based upon the subtraction between the digital image data and the digital reset data.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
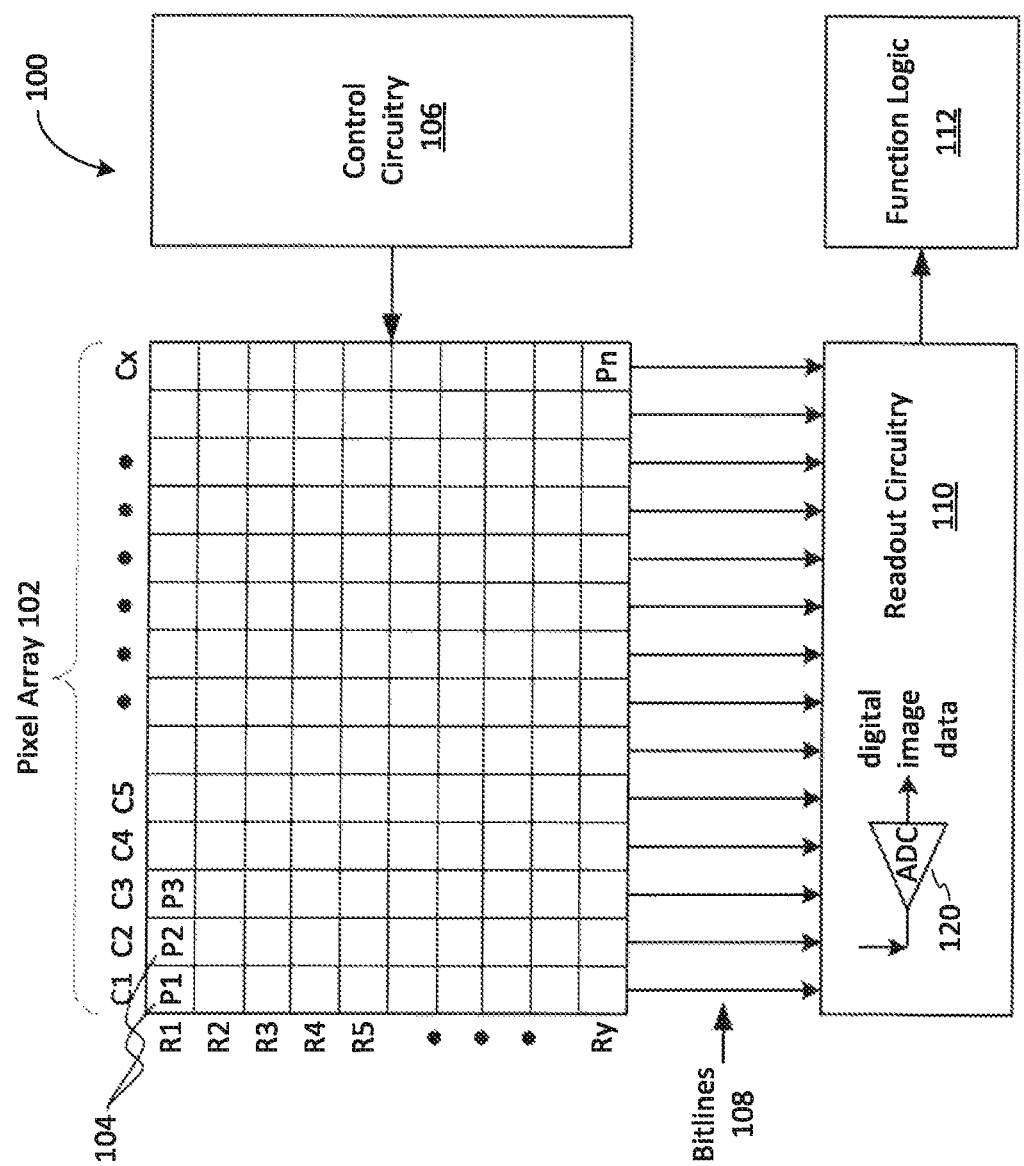
FIG. 1 illustrates one example of an imaging system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to a subrange analog to digital converter (ADC) circuitry with local ramp buffers are described herein. In the following description, numerous specific details are set forth to provide a thorough understanding of the examples. One skilled in the relevant art will recognize, however, that the techniques described herein can be practiced without one or ore of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIG. 1 illustrates one example of an imaging system 100 in accordance with an embodiment of the present disclosure. Imaging system 100 includes pixel array 102, control circuitry 106, column arranged readout bitlines 108, readout circuitry 110, and function logic 112. In one example, pixel array 102 is a two-dimensional (2D) array of photodiodes, or image sensor pixel cells 104 (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 110 and then transferred to function logic 112. The readout circuitry 110 may be coupled to read out image data from the plurality of photodiodes in pixel array 102 through bitlines 108. As will be described in greater detail below, the readout circuitry 110 includes an ADC 120. In various examples, the readout circuitry 110 may also include amplification circuitry.

In one example, function logic 112 may simply store the image data or even manipulate the image data by applying post image effects (e.g., crop, rotate, remove red eye, adjust brightness, adjust contrast, or otherwise). In one example, readout circuitry 110 may readout a row of image data at a time along readout column lines (illustrated) or may readout the image data using a variety of other techniques (not illustrated), such as a serial readout or a full parallel readout of all pixels 104 simultaneously.

In one example, imaging system 100 may be included in a digital camera, cell phone, laptop computer, security system, automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
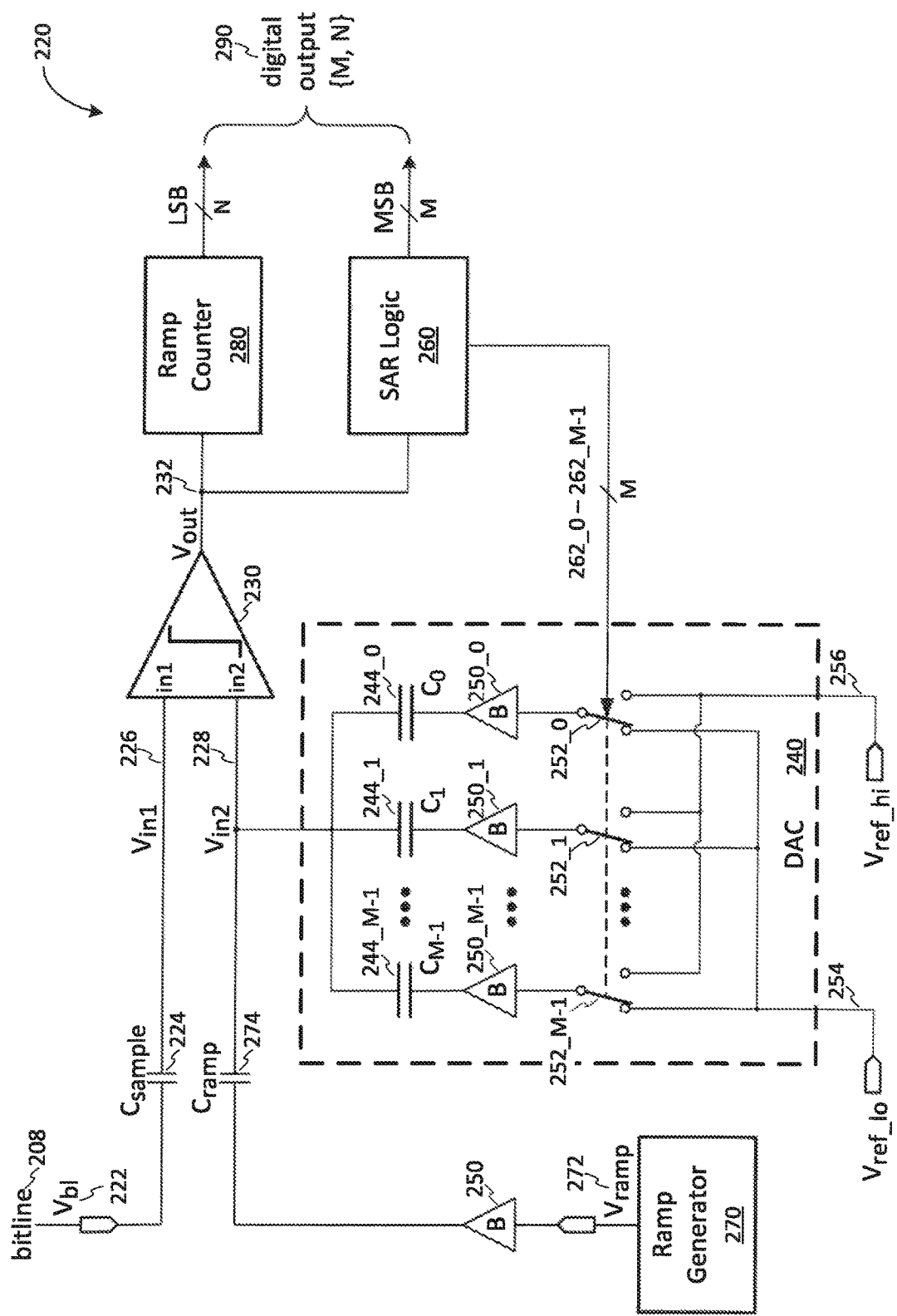
FIG. 2 is a schematic that shows one example of a subrange ADC circuit including example ramp buffer and bit buffers for each capacitors coupled to the ADC comparator in accordance with the teaching of the present disclosure.

FIG. 2 is a schematic example of a subrange ADC circuit 220 that comprises a ramp buffer 250 and its gain matched bit buffer 250_$i$ ($i$=0, 1, . . . , M−1, M is an integer) to buffer each DAC bit capacitor 244_$i$ of a successive approximation register (SAR) ADC in accordance with the teaching of the present disclosure. The subrange ADC circuit 220 is one example circuit of ADC 120 as included, for instance, in readout circuitry 110 of FIG. 1. The subrange ADC circuitry 220 converts an analog input voltage Vin 222 to a digital output code of M+N bits at the ADC output 290, where N is an integer.

In the depicted example of FIG. 2, the subrange ADC circuitry 220 is a mixture of a SAR ADC circuitry and a ramp ADC circuitry. The SAR ADC circuitry forms a so-called coarse ADC comparison that contributes to the M upper output bits (UOB) of the subrange ADC 220. The SAR ADC circuitry comprises a comparator 230, a digital-to-analog converter (DAC) 240, and a successive approximation register (SAR) logic 260. The ramp ADC circuitry forms a so-called fine ADC comparison that contributes to the N lower output bits (LOB) of the subrange ADC 220. The ramp ADC circuitry comprises the same comparator 230 that is shared with the SAR ADC circuitry, a ramp generator 270, and a ramp counter 280.

The analog image voltage signal Vbl 222 comes from the readout bitline 208. A bias current source (not shown) is coupled to the bitline 208 which provides bias current to a column of pixels 104 through the bitline. The analog signal Vbl 222 is coupled to a first input terminal of the comparator 230 as Vin1 226 through a coupling sample capacitor Csample 224, where the Csample 224 may be the only component coupled immediately between the bitine 208 and the first input of the comparator. A variable voltage Vin2 228 is coupled to a second input terminal of the comparator 230. The comparator 230 compares the signal Vin1 226 with the variable voltage Vin2 228 under control of either the SAR logic 260 or the ramp generator 270, and flips its output voltage Vout 232 when the value of Vin2 228 matches that of the Vin1 226.

For each conversion of the subrange ADC 220, a comparator output Vout 232 is first used by the SAR logic 260 to determine the M UOB—the upper M bits of the digital output. Subsequently, the comparator output Vout 232 is used by the ramp counter 280 to determine the N LOB—the lower N bits of the digital output. The combined M+N bits form the complete digital output code 290 of the subrange ADC 220.

In the sequence described above, after the SAR logic 260 has determined the M UOB code under a conventional SAR ADC operation, the Vin2 228 is set to an analog value Vin2_sar at the output of the DAC 240 by the M digital bits 262_0 through 262_M−1 which equal to the M UOB code of the SAR logic 260. The DAC 240 comprises M bit capacitors 244_0 to 244_M−1 (e.g., $C_0$ to $C_{M-1}$), M bit switches 252_0 to 252_M−1, and M bit buffers 2500 to 250_M−1. Each bit buffer 250_$i$ ($i$=0, 1, . . . , M−1) is coupled between a first terminal of each bit switch 252_$i$ and a second terminal of each bit capacitor 242_$i$. The bit switch, bit buffer, and bit capacitor connected in the way described above form a buffered bit capacitor. And each first terminal of the plurality of bit capacitors is coupled to the second input of the comparator 230.

The SAR logic 260 is coupled to provide M UOB code of the subrange ADC. The same M bits are used as DAC control bits 262 based on an output value Vout 232 of the comparator 230, wherein each of the M control bits 262 determines a switch coupling between the first terminal of the respective bit switch 252 and one of a second terminal and a third terminal. When a control bit received by each bit switch 252 is a 0, the first terminal is switched to the second terminal of the respective bit switch 252. The second terminal of each bit switch 252 is connected to a low reference voltage Vref_lo 254. When a control bit 262 received by each bit switch 252 is a 1, the first terminal is switched to the third terminal of the respective bit switch 252. The third terminal of each bit switch 252 is connected to a high reference voltage Vref_hi 256.

To continue on the sequence described above, after the SAR logic 260 has finally set Vin2 228 to Vin2_sar through the DAC 240, the ramp generator 270 starts to generate ramp voltage Vramp 272. Going through a ramp buffer 250 and a coupling ramp capacitor Cramp 274, Vramp 272 starts to drive Vin2 228 up (or down if ADC's digital output value is inversely correlated to its analog input value) from its after-SAR initial value Vin2_sar until the value of Vin2 228 at the second input of the comparator 230 crosses the image value of Vin1 226 presented at the first input. The output voltage Vout 232 triggered by the comparator 230 latches the ramp counter 280, which advances its counting number under an enabled clock signal, at the point when Vin2 crosses Vin1. The binary code of the ramp counter 280 is the N LOB of the subrange ADC. Combined with the M UOB from the SAR ADC conversion obtained earlier in the process, the final complete M+N output bits of the subrange ADC are achieved at this point.

As shown in FIG. 2, a ramp buffer 250 is coupled between the ramp generator 270 and the ramp capacitor Cramp 274 to shield (or buffer) Vin2 288 from the Vramp 272 which is generated by the ramp generator 270. This is critical for the ramp ADC to achieve high output resolution in application such as image sensors, especially for image sensors with high density of more than 2 million pixels, for example. Fixed pattern noise (FPN) which is often associated with discrepancies of column ADCs in image sensors, such as ding, may also be suppressed with the use of ramp buffer 250 in those ADCs.

The ramp buffer 250 may be made of a source follower or an operational amplifiers with a unity gain. In the case of the ramp buffer 250 made of the source follower, since the gain of the buffer is smaller than 1, the differential nonlinearity (DNL) error is present due to the discrepancy in binary ratio between the coarse SAR ADC and the fine ramp ADC. To resolve this discrepancy issue, the bit buffer 250_$i$ is coupled between the first terminal of bit switch 252_$i$ and the bit capacitor 244_$i$. For consistency, the buffers of the ramp buffer 250 and each of the bit buffers 250_0 to 250_M−1 are made of the very same kind of buffers, either source follows or operational amplifiers with the same gain, normally a near unity gain, or any other kind of buffers that may be known to people and commonly used.

In FIG. 2, the M bit buffers 250 are directly connected to M hit capacitors 244. At the end of each SAR operation, before Vramp starts to ramp voltage up, Vin2 equals to Vin2_sar. Vin2_sar is set by the M bit switches 252_0 to 252_M-1 which is determined by their respective M SAR control bits 262_0 to 262_M-1. Without the bit buffer 252_i coupled in between, bit capacitor 244_i may be connected directly to either the low reference voltage Vref_lo 254 or the high reference voltage Vref_hi 256 under different values of each control bit 262_i. That may cause the load at Vin2 to change a little depending on which reference voltage (high or low) the bit capacitor 244 is connecting to. With the bit buffer 252_i, the bit capacitor 244 is constantly connected to the bit buffer at all time which isolates the bit capacitor 244 from being directly connected to either reference voltages Vref_lo or Vref_hi. As a consequence, since Vin2 sees a near constant load from the M buffered bit capacitors regardless how the SAR settings are, correlated double sampling (CDS) or black level calibration (BLC) may be carried out with more accuracy due to the signal-independent offset. And the fact is, the same offsets received through different samplings during CDS or BLC can be cancelled through subtractions.

For example, if a UOB_dc associated Vin2_sar_dc is a result of a dark current (dark current is a status measured when a pixel cell Pi 104 is under reset and also placed in darkness), and an UOB_sig associated Vin2_sar_sig is a result of an image signal, regardless how different the codes are between UOB_dc and UOB_sig, the load of the DAC 240 experienced by the Vramp 272 should remain the same. Subsequently, when Vramp starts to ramp up (or down if the ADC output value changes in the opposite direction of its input value) voltage level at Vin2 from an initial Vin2_sar during ramp operation, the ramp ADC takes over and carries on the analog-to-digital conversion related to the fine N LOB bits. For different ramps, the M UOB signal-independent offset value, which is related to DNL error, may be easily cancelled out at a later time in the digital domain.

For the subrange ADC 220 as a whole, Vin2 228 is more stable with respect to the various couplings of voltage sources Vref_lo 254, Vref_hi 256, or Vramp 272 when buffered by the ramp buffer 250 and bit buffers 250_0 to 250_MA. To further reduce DNL error, it is a good practice to have the ramp buffer 250 and bit buffers 250_0 to 250_M-1 made of exactly the same kind of buffers with essentially the same voltage gains as mentioned earlier. That way, the binary ratio between the coarse SAR ADC and the fine ramp ADC may be perfectly matched and well maintained.

In one embodiment, for the example subrange ADC 220 shown in FIG. 2 to work properly, the capacitance value of $C_{i+1}$ may be twice as much as that of $C_i$ for the bit capacitors. Capacitance value of the sample capacitor $C_{sample}$ 224 may be twice as much as that of $C_{M-1}$. The ramp capacitor Cramp 274 and bit capacitor $C_0$ 244_0 may have the same capacitance value.

Since a subrange ADC is a combined ADC with a SAR ADC providing UOB output code and a ramp ADC providing LOB output code, it requires exponentially fewer comparators than flesh ADCs. It also consumes less silicon area and less power. It takes advantages of a SAR ADC with just enough resolution for UOB at relative high speed, faster than a ramp ADC acted alone throughout, and a ramp ADC with high resolution for LOB at relative low speed achieved but with simpler circuit. Subrange ADC becomes a natural choice for automotive and security applications which requires high dynamic range of more than 12-bit resolution to deal with very bright lights.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A subrange analog-to-digital converter (ADC), comprising:
    a bitline;
    a sample capacitor coupled between the bitline and a first input of a comparator;
    a ramp buffer coupled between a ramp generator and a first terminal of a ramp capacitor, wherein a second terminal of the ramp capacitor is coupled to a second input of the comparator;
    a digital-to-analog converter (DAC) comprising M buffered bit capacitors, wherein M is an integer, wherein each of the M buffered bit capacitors comprises a bit capacitor, a bit buffer, and a bit switch, wherein a first terminal of the bit capacitor is coupled to the second input of the comparator, wherein the bit buffer is coupled between a second terminal of the bit capacitor and a first terminal of the bit switch, and wherein the ramp buffer and the bit buffer of each of the M buffered bit capacitors are identical buffers;
    a successive approximation register (SAR) logic coupled to provide M upper output bits (UOB) of the subrange ADC determined by an output value of the comparator, wherein each bit of the M UOB determines a coupling between the first terminal of the respective bit switch and one of a second terminal and a third terminal; and
    a ramp counter coupled to the output of the comparator to latch and provide N lower output bits (LOB) of the subrange ADC when the output of the comparator flips its value, wherein N is an integer.

2. The subrange ADC of claim 1, further comprises a high reference voltage coupled to the second terminal of the bit switch of each buffered bit capacitor and a low reference voltage coupled to a third terminal of the bit switch of each buffered bit capacitor.

3. The subrange ADC of claim 1, wherein M is an integer larger than 1 and N is an integer larger than 1, and wherein the M UOB and the N LOB consist of all the digital output bits of the subrange ADC.

4. The subrange ADC of claim 1, wherein the ramp buffer and the bit buffer of each buffered bit capacitor are source followers.

5. The subrange ADC of claim 1, wherein the ramp buffer and the bit buffer of each buffered bit capacitor are operational amplifiers with unity gain.

6. The subrange ADC of claim 1, wherein the capacitance of the ramp capacitor equals to the capacitance of the bit capacitor of a first buffered bit capacitor controlled by the least significant bit of the M UOB.

7. The subrange ADC of claim 6, wherein the capacitance of the bit capacity or of a second buffered bit capacitor is twice as much as the capacitance of the bit capacitor of the first buffered bit capacitor, wherein the capacitance of the bit capacitor of a third buffered bit capacitor is twice as much as the capacitance of the bit capacitor of the second buffered bit capacitor, and wherein the capacitance of the sample capacitor is twice as much as the capacitance of the bit capacitor of the third buffered bit capacitor.

8. The subrange ADC of claim 6, wherein the capacitance of the bit capacitor of an i-th buffered bit capacitor is twice as much as the capacitance of the bit capacitor of an (i−1)-th buffered bit capacitor, and wherein the capacitance of the sample capacitor is twice as much as the capacitance of the bit capacitor of the M-th buffered bit capacitor.

9. A subrange analog-to-digital converter (ADC) image sensing system, comprising:
a pixel array including a plurality of pixels;
control circuitry coupled to the pixel array to control operation of the pixel array;
readout circuitry coupled to the pixel array through a bitline to read out analog image data from the pixel array, wherein the readout circuitry comprises a subrange analog-to-digital converter (ADC) to convert analog image data to digital image data, wherein the subrange ADC comprises:
a sample capacitor coupled between the bitline and a first input of a comparator,
a ramp buffer coupled between a ramp generator and a first terminal of a ramp capacitor, wherein a second terminal of the ramp capacitor is coupled to a second input of the comparator,
a digital-to-analog converter (DAC) comprising M buffered bit capacitors, wherein M is an integer, wherein each of the M buffered bit capacitors comprises a bit capacitor, a bit buffer, and a bit switch, wherein a first terminal of the bit capacitor is coupled to the second input of the comparator, wherein the bit buffer is coupled between a second terminal of the bit capacitor and a first terminal of the bit switch, and wherein the ramp buffer and the bit buffer of each of the M buffered bit capacitors are identical buffers,
a successive approximation register (SAR) logic coupled to provide M upper output bits (UOB) of the subrange ADC determined by an output value of the comparator, wherein each bit of the UOB determines a coupling between the first terminal of the respective bit switch and one of a second terminal and a third terminal, and
a ramp counter coupled to the output of the comparator to latch and provide N lower output bits (LOB) of the subrange ADC when the output of the comparator flips its value, wherein N is an integer; and
a bias current source coupled to the bitline, wherein the bias current source provides bias current to the pixel through the bitline.

10. A subrange ADC image sensing system of claim 9, further comprises a high reference voltage coupled to the second terminal of the bit switch of each buffered bit capacitor and a low reference voltage coupled to a third terminal of the bit switch of each buffered bit capacitor.

11. The subrange ADC image sensing system of claim 9, wherein M is an integer larger than 1 and N is an integer larger than 1, and wherein the M UOB and the N LOB consist of all the digital output bits of the subrange ADC.

12. The subrange ADC image sensing system of claim 9, wherein the ramp buffer and the bit buffer of each buffered bit capacitor are source followers.

13. The subrange ADC image sensing system of claim 9, wherein the ramp buffer and the bit buffer of each buffered bit capacitor are operational amplifiers with unity gain.

14. The subrange ADC image sensing system of claim 9, wherein the capacitance of the ramp capacitor equals to the capacitance of the bit capacitor of a first buffered bit capacitor controlled by the least significant bit of the M UOB.

15. The subrange ADC image sensing system of claim 14, wherein the capacitance of the bit capacitor of a second buffered bit capacitor is twice as much as the capacitance of the bit capacitor of the first buffered bit capacitor, wherein the capacitance of the bit capacitor of a third buffered bit capacitor is twice as much as the capacitance of the bit capacitor of the second buffered bit capacitor, and wherein the capacitance of the sample capacitor is twice as much as the capacitance of the bit capacitor of the third buffered bit capacitor.

16. The subrange ADC image sensing system of claim 14, wherein the capacitance of the bit capacitor of an i-th buffered bit capacitor is twice as much as the capacitance of the bit capacitor of the (i−1)-th buffered bit capacitor, and wherein the capacitance of the sample capacitor is twice as much as the capacitance of the bit capacitor of the M-th buffered bit capacitor.

* * * * *